(12) United States Patent
Delano et al.

(10) Patent No.: US 9,665,138 B2
(45) Date of Patent: May 30, 2017

(54) MICRO-HOLE VENTS FOR DEVICE VENTILATION SYSTEMS

(71) Applicant: Microsoft Technology Licensing, LLC, Redmond, WA (US)

(72) Inventors: Andrew Douglas Delano, Woodinville, WA (US); John R. Haley, Sammamish, WA (US); Jeffrey Taylor Stellman, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 260 days.

(21) Appl. No.: 14/247,181

(22) Filed: Apr. 7, 2014

(65) Prior Publication Data
US 2015/0286256 A1    Oct. 8, 2015

(51) Int. Cl.
*G06F 1/20* (2006.01)
*G06F 1/16* (2006.01)
*H05K 7/20* (2006.01)

(52) U.S. Cl.
CPC .......... *G06F 1/203* (2013.01); *G06F 1/1656* (2013.01); *H05K 7/20136* (2013.01); *Y10T 29/49002* (2015.01)

(58) Field of Classification Search
CPC ..... G06F 1/20–1/203; G06F 2200/201; H05K 7/20009–7/20209; B01D 2279/45;
(Continued)

(56) References Cited

U.S. PATENT DOCUMENTS 2,955,064 A * 10/1960 Frohmader ............ B01D 46/10
106/625
5,858,044 A * 1/1999 Nepsund ............ B01D 46/0024
55/486
(Continued)

FOREIGN PATENT DOCUMENTS

| CN | 100490607 | 4/2006 |
|---|---|---|
| CN | 103037041 | 4/2013 |
| WO | WO-2013131374 | 9/2013 |

OTHER PUBLICATIONS

Potomac, potomac laser.pdf, Nov. 11, 2013, Potomac.*
(Continued)

*Primary Examiner* — Zachary M Pape
*Assistant Examiner* — Amir Jalali

(57) ABSTRACT

Micro-hole vents for device ventilation systems are described herein that may be formed as a plurality of micro-holes that are invisible to unaided human eyes. The micro-holes are configured to blend into the housing for a computing device such that the holes are substantially concealed from users of the computing device. A micro-hole vent may be aligned with a blower for a ventilation system to enable air intake through the corresponding micro-holes for cooling of components within the housing. In addition or alternatively, one or more exhaust vents for the ventilation system may also be configured as micro-hole vents. Each micro-hole vent may have many, very small holes for sufficient air flow. For example, micro-holes having diameters of about fifty to two hundred microns may be arranged in a pattern with a coverage in a range of about twelve thousand to fifty thousand holes per square inch.

20 Claims, 9 Drawing Sheets

(58) Field of Classification Search
CPC ........ B01D 46/10; B01D 46/54; B29C 70/46;
B29C 70/546; B29C 70/467; B29C 70/54
USPC ....... 361/679.49–679.51, 692–695; 454/184;
55/385.6, 385.4
See application file for complete search history.

(56) References Cited

U.S. PATENT DOCUMENTS

| | | | |
|---|---|---|---|
| 7,290,401 B2 | 11/2007 | Hermerding | |
| 7,808,780 B2* | 10/2010 | Brunschwiler | G06F 1/20 165/104.33 |
| 7,891,410 B1 | 2/2011 | Monson et al. | |
| 2001/0027132 A1* | 10/2001 | Nagata | G06F 1/20 463/46 |
| 2002/0060900 A1* | 5/2002 | Qiu | F04D 29/601 361/679.57 |
| 2003/0042176 A1* | 3/2003 | Alderson | B01D 15/00 209/17 |
| 2003/0050002 A1* | 3/2003 | Pfister | H05K 7/20127 454/184 |
| 2004/0070942 A1* | 4/2004 | Tomioka | G06F 1/203 361/700 |
| 2004/0081596 A1* | 4/2004 | Hsi | A61L 9/205 422/186.3 |
| 2004/0228086 A1* | 11/2004 | Lin | G06F 1/203 361/679.48 |
| 2005/0135075 A1* | 6/2005 | Deng | G06F 1/20 361/797 |
| 2005/0211418 A1* | 9/2005 | Kenny | F04B 17/00 165/80.4 |
| 2006/0023419 A1* | 2/2006 | Kao | H05K 7/20172 361/690 |
| 2006/0141921 A1* | 6/2006 | Turek | H05K 7/20736 454/184 |
| 2006/0146493 A1* | 7/2006 | Wang | G06F 1/203 361/679.46 |
| 2006/0164806 A1* | 7/2006 | Huang | G06F 1/203 361/691 |
| 2007/0034356 A1* | 2/2007 | Kenny | F04B 17/00 165/80.4 |
| 2007/0053168 A1* | 3/2007 | Sayir | B32B 18/00 361/718 |
| 2007/0066198 A1* | 3/2007 | Rambosek | B01D 46/10 451/533 |
| 2007/0151920 A1* | 7/2007 | Kay | B01D 29/012 210/500.1 |
| 2008/0034971 A1* | 2/2008 | McIntosh | B01D 46/0028 95/273 |
| 2009/0002932 A1* | 1/2009 | Lord | A47B 21/0314 361/679.56 |
| 2010/0103616 A1 | 4/2010 | Hwang et al. | |
| 2011/0122560 A1* | 5/2011 | Andre | G09F 9/30 361/679.01 |
| 2011/0159797 A1* | 6/2011 | Beltman | G06F 1/20 454/338 |
| 2011/0176271 A1* | 7/2011 | Zhang | G06F 1/20 361/679.33 |
| 2011/0215046 A1* | 9/2011 | Rogers | B01D 39/1615 210/491 |
| 2011/0310557 A1* | 12/2011 | Ooe | G06F 1/203 361/692 |
| 2012/0131979 A1 | 5/2012 | Yang et al. | |
| 2012/0160136 A1* | 6/2012 | Lineal | A47B 23/04 108/43 |
| 2012/0224324 A1 | 9/2012 | You | |
| 2013/0096646 A1 | 4/2013 | Yildirim et al. | |
| 2013/0286292 A1* | 10/2013 | Yamaguchi | G06F 1/203 348/725 |
| 2014/0002750 A1* | 1/2014 | Hamada | H05K 7/202 348/725 |
| 2014/0049915 A1* | 2/2014 | Wang | H05K 7/20127 361/694 |
| 2014/0150658 A1* | 6/2014 | Prax | B01D 46/10 96/74 |
| 2014/0210325 A1* | 7/2014 | Aurongzeb | H05K 5/0213 312/236 |
| 2014/0235156 A1* | 8/2014 | Li | H05K 7/20154 454/184 |
| 2014/0245332 A1* | 8/2014 | Oh | G11B 33/144 720/649 |
| 2014/0290917 A1* | 10/2014 | Chang | G06F 1/203 165/121 |
| 2015/0003007 A1* | 1/2015 | MacDonald | F04D 29/281 361/679.46 |
| 2015/0017905 A1* | 1/2015 | Li | H05K 7/20136 454/184 |
| 2015/0036291 A1* | 2/2015 | Yuan | G06F 1/1628 361/690 |
| 2015/0096274 A1* | 4/2015 | Shibata | F01N 3/0222 55/502 |

OTHER PUBLICATIONS

Lenox Laser, leonx laser.pdf, Jul. 6, 2013, Lenox Laser.*
Broude, "Micro-hole drilling with lasers", Retrieved From: <http://www.industrial-lasers.com/articles/print/volume-27/issue-04/features/micro-hole-drilling-with-lasers.html> Mar. 12, 2014, Jul. 1, 2012, 5 Pages.

* cited by examiner

800

802
Form a plurality of micro-holes in one or more vent surfaces for a housing of a computing device that are visually imperceptible to human eyes and enable air flow for a ventilation system of the computing device

804
Create micro-holes directly in the housing for one of said vent surfaces

806
Produce a separate cover portion having micro-holes that is configured for attachment to one of said vent surfaces of the housing

808
Arranging one or more components within a housing of a computing device including mounting a blower for the ventilation system in alignment with one of the vent surfaces to enable air intake through corresponding micro-holes for cooling of the computing device

Fig. 8

MICRO-HOLE VENTS FOR DEVICE VENTILATION SYSTEMS

SUMMARY

Micro-hole vents for device ventilation systems are described herein. In one or more implementations, a micro-hole vent is formed as a plurality of micro-holes that are invisible to unaided human eyes. The micro-holes are configured to blend into the housing for a computing device such that the holes are substantially concealed from users of the computing device. A micro-hole vent may be aligned with a blower for a ventilation system to enable air intake through the corresponding micro-holes for cooling of components within the housing. In addition or alternatively, one or more exhaust vents for the ventilation system may also be configured as micro-hole vents. Each micro-hole vent may have many, very small holes for sufficient air flow. For example, micro-holes having diameters of about fifty to two hundred microns may be arranged in a pattern with a coverage in a range of about twelve thousand to fifty thousand holes per square inch.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

FIG. 8 depicts an example procedure for assembly of a computing device that includes one or more micro-vents in accordance with one or more implementations.

DETAILED DESCRIPTION

Overview

Computing devices are available in an ever increasing variety of configurations. As component size has decreased, the configurations of the computing devices have expanded from traditional desktop computers to laptop computers, mobile phones (e.g., "smartphones"), tablet computers, gaming devices, and so on. Considerations such as heat transfer and cooling may become increasingly problematic when confronted with thin form device configurations. The thinness of some devices limits the amount of space (area and volume) available for heat transfer devices and ventilation system components, such as blowers and vents. Device thinness may make some traditional ventilation system designs impractical. Additionally, for small devices the surface space consumed by vents (e.g., intake and exhaust ports) may take up a relatively large portion of the device exterior in comparison to larger devices and vents that are visible on exterior surfaces of a device may be aesthetically unpleasing to some consumers. Therefore, design of vents presents a considerable challenge particularly in relation to thin form devices.

Micro-hole vents for device ventilation systems are described herein. In one or more implementations, a micro-hole vent is formed as a plurality of micro-holes that are invisible to unaided human eyes. The micro-holes are configured to blend into the housing for a computing device such that the holes are substantially concealed from users of the computing device. A micro-hole vent may be aligned with a blower for a ventilation system to enable air intake through the corresponding micro-holes for cooling of components within the housing. In addition or alternatively, one or more exhaust vents for the ventilation system may also be configured as micro-hole vents. Each micro-hole vent may have many, very small holes for sufficient air flow. For example, micro-holes having diameters of about fifty to two hundred microns may be arranged in a pattern with a coverage in a range of about twelve thousand to fifty thousand holes per square inch.

In the following discussion, an example environment is first described that may employ the heat transfer techniques described herein. Example procedures are then described which may be performed in the example environment as well as other environments. Consequently, performance of the example procedures is not limited to the example environment and the example environment is not limited to performance of the example procedures.

Example Operating Environment

Figure 1:
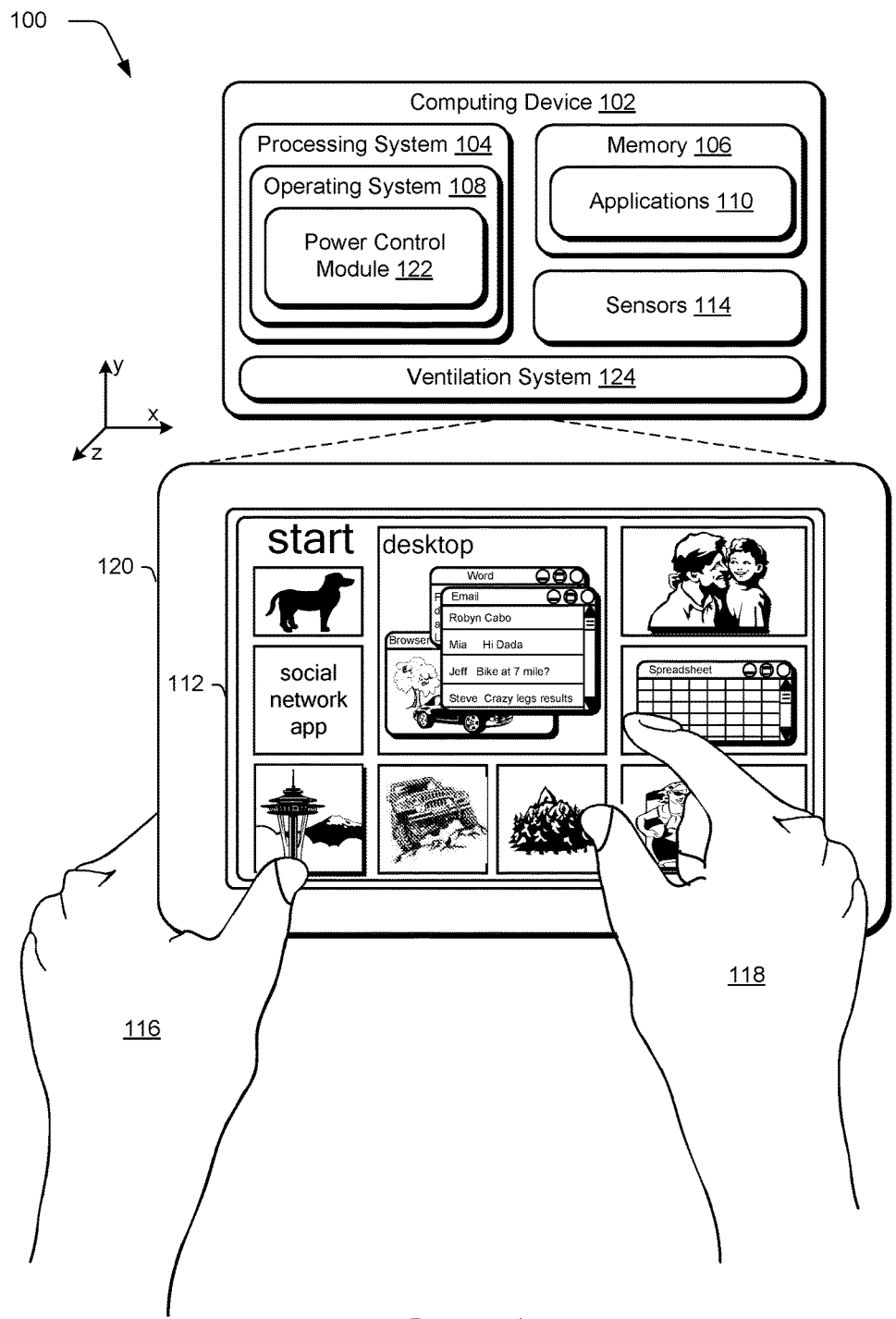
FIG. 1 is an illustration of an environment in an example implementation that is operable to employ micro-hole vents in accordance with one or more implementations.

FIG. 1 is an illustration of an environment 100 in an example implementation that is operable to employ techniques described herein. The illustrated environment 100 includes a computing device 102 having a processing system 104 and a computer-readable storage medium that is illustrated as a memory 106 although other configurations are also contemplated as further described below.

The computing device 102 may be configured in a variety of ways. For example, a computing device may be configured as a computer that is capable of communicating over a network, such as a desktop computer, a mobile station, an entertainment appliance, a set-top box communicatively coupled to a display device, a wireless phone, a game console, and so forth. Thus, the computing device 102 may range from full resource devices with substantial memory and processor resources (e.g., personal computers, game consoles) to a low-resource device with limited memory and/or processing resources (e.g., traditional set-top boxes, hand-held game consoles). Additionally, although a single computing device 102 is shown, the computing device 102 may be representative of a plurality of different devices, such as multiple servers utilized by a business to perform operations such as by a web service, a remote control and set-top box combination, an image capture device and a game console configured to capture gestures, and so on. Further discussion of different configurations that may be assumed by the computing device may be found in relation to FIG. 9.

The computing device 102 is further illustrated as including an operating system 108. The operating system 108 is configured to abstract underlying functionality of the computing device 102 to applications 110 that are executable on the computing device 102. For example, the operating system 108 may abstract the processing system 104, memory 106, network, and/or display device 112 functionality of the computing device 102 such that the applications 110 may be written without knowing "how" this underlying functionality is implemented. The application 110, for instance, may provide data to the operating system 108 to be rendered and displayed by the display device 112 without understanding how this rendering will be performed. The operating system 108 may also represent a variety of other functionality, such as to manage a file system and user interface that is navigable by a user of the computing device 102.

The computing device 102 may support a variety of different interactions. For example, the computing device 102 may include one or more hardware devices that a user may manipulate to interact with the device, such as a keyboard, cursor control device (e.g., a mouse, track pad, or touch device), and so on. The computing device 102 may also support gestures, which may be detected in a variety of ways. The computing device 102, for instance, may support touch gestures that are detected using touch functionality of the computing device 102. The sensors 114, for instance, may be configured to provide touchscreen functionality in conjunction with the display device 112, alone as part of a track pad, and so on. An example of this is illustrated in FIG. 1 in which first and second hands 116, 118 of a user are illustrated. The first hand 116 of the user is shown as holding a housing 120 of the computing device 102. The second hand 118 of the user is illustrated as providing one or more inputs that are detected using touchscreen functionality of the display device 112 to perform an operation, such as to make a swipe gesture to pan through representations of applications in the start menu of the operating system 108 as illustrated.

Thus, recognition of the inputs may be leveraged to interact with a user interface output by the computing device 102, such as to interact with a game, an application, browse the internet, change one or more settings of the computing device 102, and so forth. The sensors 114 may also be configured to support a natural user interface (NUI) that may recognize interactions that may not involve touch. For example, the sensors 114 may be configured to detect inputs without having a user touch a particular device, such as to recognize audio inputs through use of a microphone. For instance, the sensors 114 may include a microphone to support voice recognition to recognize particular utterances (e.g., a spoken command) as well as to recognize a particular user that provided the utterances.

In another example, the sensors 114 may be configured to detect movement of the computing device 102 in one or more dimensions, such as the x, y, and z dimensions as illustrated, through use of accelerometers, gyroscopes, inertial measurement units (IMUs), magnetometers, and so on. This movement may be recognized in whole or in part as part of a definition of a gesture. For example, movement of the computing device 102 in the z axis may be used to zoom in a user interface displayed on the display device 112, rotation through the x axis may be used to steer a car in a video game, and so on. Thus, in this example the computing device 102 may be moved through a variety of different orientations to support interaction with the device.

In a further example, the sensors 114 that may be configured to recognize gestures, presented objects, images, and so on through implementations as one or more cameras. The cameras, for instance, may be configured to include multiple lenses so that different perspectives may be captured and thus determine depth. The different perspectives, for instance, may be used to determine a relative distance from the sensors 114 and thus a change in the relative distance. The different perspectives may be leveraged by the computing device 102 as depth perception. The images may also be leveraged by the computing device 102 to support a variety of other functionality, such as techniques to identify particular users (e.g., through facial recognition), objects, and so on. It should also be noted that the sensors 114 may also support detection of movement as described above in one or more of the x, y, or z axes through implementation as a camera.

The computing device 102 is further illustrated as including a power control module 122. The power control module 122 is representative of functionality to cause a device to enter different power consumption states. The processing system 104, for instance, may be configured to support a low power state in which processing resources are lessened and power consumption of the processing system 104 is also lessened. Thus, the processing system 104 may be configured to conserve resources (e.g., from a battery) while in this low power state.

During operation, the processing system 104 and other components may act as heat-generating devices that may produce heat levels in excess of "safe" limits if left unmitigated. As such thermal limits are approached, the computing device may have to be shutdown and/or operation of the processing system 104 may be throttled, which adversely affects performance. Accordingly, computing devices may include some type of thermal management system to manage heat-generating device.

In accordance with principles discussed in this document, the computing device 102 includes a ventilation system 124 used for thermal management that may include one or more micro-vents. As discussed in the details section that follows, the micro-vents may be formed as a plurality of very small micro-holes that are invisible to unaided human eyes. In other words, the micro-holes may be configured to be imperceptible to users at ordinary viewing distances and angles. Even upon closer inspection by users the micro-holes may remain undetected or be very difficult to see. A large number of micro-holes may be employed for each vent to enable sufficient air flow for cooling.

Micro-Hole Vent Implementation Details

Figure 2:
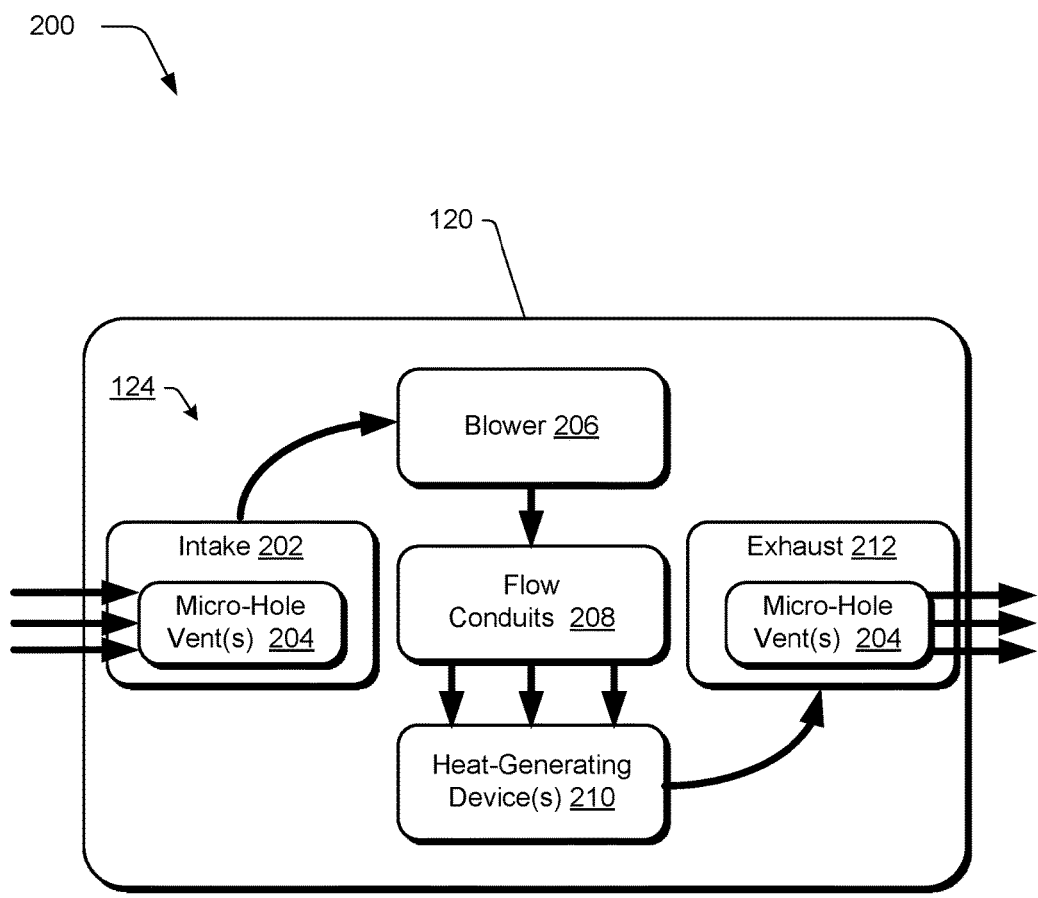
FIG. 2 depicts an example implementation of a ventilation system of FIG. 1 that includes micro-hole vents.

FIG. 2 depicts generally at 200 an example representation of a ventilation system 124 of FIG. 1 that employs micro-hole vents in accordance with one or more implementations.

FIG. 2 additionally represents flow through the ventilation system 124 for cooling of components of a corresponding computing device using arrows to show the general flow path from component to component. Although aspects are described herein in relation to air cooling, comparable techniques may be used in connection with other types of fluid cooling systems that employ different types of gases and even liquids.

In the example of FIG. 2, the ventilation system 124 is illustrated as being arranged within a housing 120 of a computing device. The ventilation system 124 includes an intake 202 that is associated with one or more micro-hole vents 204. A blower 206 is provided that is designed to pull air from an exterior of the housing 120 through the micro-hole vents 204 into an interior of the housing. The blower 206 is representative of functionality to move and disperse cooling fluid for the system, which in this case is air. The blower 206 may be configured in various ways, such as being an axial fan or a centrifugal blower for moving air. Pumps, impellers, and other types of fluid movers may also be employed in alternative designs and/or in conjunction with other types of cooling fluids.

As represented, the blower 206 is designed to disperse air throughout the interior of the housing via one or more flow conduits 208 to various heat-generating devices 210. Various types of flow conduits 208 are contemplated such as channels that are formed in the housing, piping systems, tubes, manifolds, baffles, and so forth. The heat-generating devices 210 may include a processing system 104 as described in relation to FIG. 1 as well as other components of the computing device such as a power supply unit, a battery, a microprocessor, and a graphics processor, to name a few examples.

Cooling air that is drawn into the device by the blower 206 and delivered to the heat-generating devices 210 operates to cool the device by thermal conductivity, which heats up the air. The heated air flows from the heat-generating devices 210 to exhaust 212 components of the ventilation system. The exhaust 212 may be configured to include various kinds of vents including vents having grates and/or relatively large holes/passages that are visible to human eyes. Optionally, one or more vents employed for the exhaust 212 may also be configured as micro-hole vents 204 as represented in FIG. 2.

Micro-hole vents 204 represent structures that enable air (or other fluids) to be passed between separate areas, such as between an exterior and interior of a housing 120. Generally, the micro-hole vents 204 are designed to allow sufficient flow for a particular application and such that the vents are invisible or barely visible to users (e.g., unaided human viewers). In order to achieve both of these considerations, the number holes placed in a vent area (e.g., the coverage) is very large to support the amount of flow and the size of the holes employed is very small to hide the holes and corresponding vent. For example, in one or more implementations, micro holes may be configured be less than about two hundred and fifty microns wide in at least one dimension. Micro-holes of such small sizes may be substantially invisible to unaided human eyes. As noted, micro-hole vents 204 may be employed for either or both of intakes and exhaust for the ventilation system. The micro-hole vents 204 may each include a plurality of micro-holes that are visually imperceptible to users under normal interactions with the device.

Additionally, the vent area may be configured to match the visual appearance of the surrounding part of the housing so that the micro-hole vent blends in and is therefore harder to see. For example, vent portions may be configured to match characteristics such as the texture, color, material, and/or patterning of the surface of a housing. Matching the visual appearance may assist in concealment of the micro-hole vents 204. Additionally, matching of the visual appearance may involve the use of obfuscation patterning/textures across a surface of the housing (e.g., an etched pattern). Use of obfuscation patterning/textures may enable a vent area to have at least some relatively larger holes (e.g., holes with diameters above two hundred microns) that would potentially be visible in the absence of the patterning, but that nonetheless are concealed by the obfuscation patterning/textures.

In particular, the micro-holes may be tightly packed together within portions of the housing designated for the micro-hole vents 204. For instance, the portions of the housing having micro-hole vents 204 may have greater than about fifty percent open area. The micro-holes may be arranged in a pattern such as a hexagonal (e.g., honey-comb) or other polygonal pattern, a checkerboard pattern, in offset rows and/or columns, or a spiral pattern, to name a few examples. In implementation, the micro-holes may have diameters that are within a range of about fifty microns to two-hundred microns. The size may be selected to ensure proper air flow as well as concealment of the vents and different sizes may be employed for different vents, surfaces, and/or computing devices. Additionally, multiple different sizes of holes may be used for a single micro-hole vent 204. In one or more implementations, the coverage of the holes for areas having micro-hole vents is in a range of about twelve-thousand to fifty thousand holes per square inch. Thus, a vent area of two to four square inches may contain approximately twenty-four thousand to one-hundred thousand individual micro-holes depending upon the application and/or designed flow levels.

In an implementation, the micro-holes are formed as generally circular tubes that extend through a wall of the housing or a cover portion constructed for a vent area of the housing (e.g., a separate, attachable vent cover piece). The micro-holes may behave like tiny pipes from a fluid flow perspective. The micro-holes for a vent area and/or cover piece may be formed in any suitable way including, but not limited to, laser etching, drilling, mechanical punching, chemical etching, molding, and so forth. Although circular tubes may be employed, other structures such as conical shaped tubes, elliptical pipes, hexagonal shaped structures, and even rectangular passages may be formed depending upon the particular application and formation techniques utilized.

Figure 3:
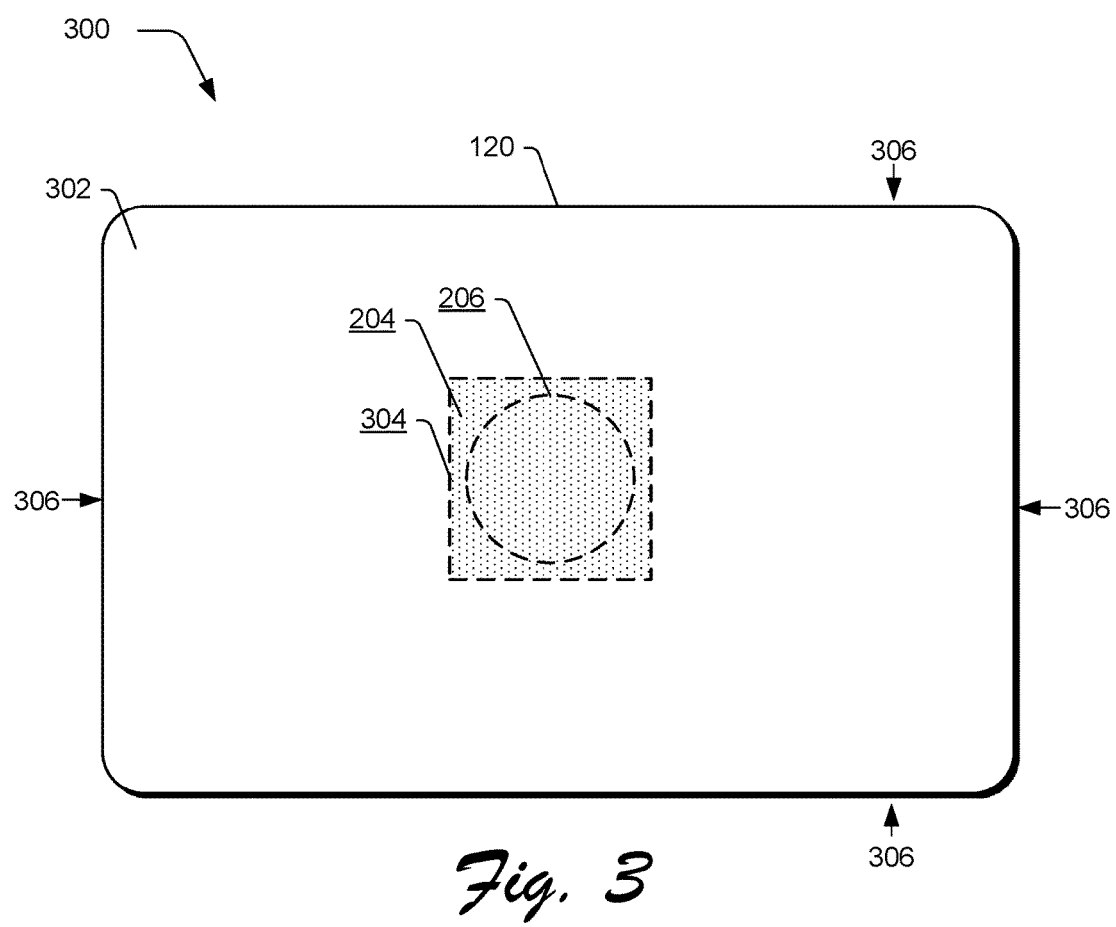
FIG. 3 depicts an example implementation of a micro-hole vent formed directly within a housing of a computing device.

As noted previously, micro-holes may be formed directly through a housing and/or as a separate cover portion designed as an attachable vent cover piece that attaches to a vent area of the housing (e.g., a passage or cut-out in a surface of the housing). In particular, FIG. 3 depicts generally at 300 an example implementation of a micro-hole vent formed directly within a housing of a computing device. Here, a back surface 302 of a housing 120 is illustrated as having a vent area 304 configured in accordance with one or more implementations. The back surface 302 may be considered a surface that is opposite of a front surface configured to contain a display device 112, such as the surface shown for the example computing device 102 of FIG. 1. In the depicted example of FIG. 3, the vent area 304 is generally centrally located both horizontally and vertically with respect to the back surface 302, although other locations on the back surface, along various edges 306, and/or on a front surface (not shown) are also contemplated. Additionally, while a generally rectangular vent area is shown, areas having other regular shapes (elliptical, circular, hexagonal, etc.) and irregular shapes may also be employed. Further, the example vent area is depicted as having a micro-hole vent 204 that fills the vent area. The micro-hole vent 204 is depicted as being aligned with a blower 206 and/or a position for mounting a blower within the housing 120. In this arrangement, the micro-hole vent 204 is positioned directly above and/or in-line with an air intake for the blower 206.

The micro-hole vent 204 may be configured to include a pattern of multiple micro-holes as described previously. In this example, the micro-holes are formed directly in the housing 120. By way of example and not limitation, the housing 120 may be constructed of metal (e.g., a magnesium alloy or other alloy) and the micro-holes may be formed directly through a surface of the metal housing, e.g., the back surface 302 in this example. The notion of the micro-hole vent 204 being formed directly in the housing is represented by the dashed line that defines the vent area 304.

Figure 4:
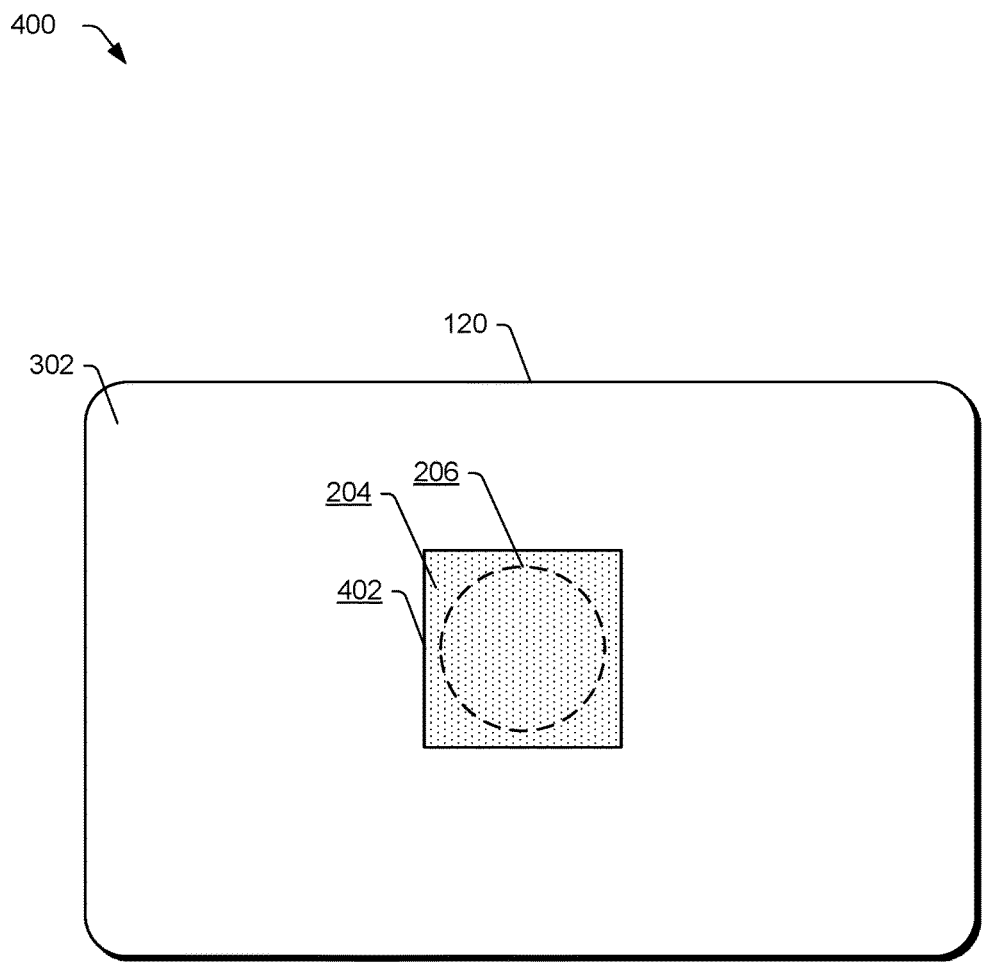
FIG. 4 depicts an example implementation of a micro-hole vent for a housing of a computing device that is formed as a separate cover portion that is attached to the housing.

In contrast, FIG. 4 depicts generally at 400 an example implementation of a micro-hole vent for a housing of a computing device that is formed as a separate cover portion that is attached to the housing. Here, a cover portion 402 for the vent area is represented by a solid line. The cover portion 402 may be formed as a separate piece that is then integrated with the housing. Forming the vent separately as a cover piece enables the cover piece to have different characteristics than the housing itself. For example, the housing and cover piece may be made from different materials, have different thicknesses, have different thermal properties, and so forth. For instance, the housing and cover piece may be made of different metals. In another example, the housing may be made of metal or a metal alloy and the cover piece may be a plastic insert for the housing. The cover portion 402 is configured as a micro-hole vent 204 having a pattern of micro-holes. The cover portion 402 may be attached to the housing such that the cover portion 402 and micro-holes are aligned with the blower 206 and/or a position for mounting a blower within the housing 120.

The cover portion 402 may be attached to the housing 120 in various ways. For example, the housing 120 may include a passage, cutout, or receptacle into which the cover portion 402 may be received. The cover portion 402 may then be secured in place using various techniques such as welding, soldering, mechanical fasteners, clips, adhesive and so forth. Generally, the passage, cutout, or receptacle of the housing is configured to match a footprint of the cover portion 402, such as the rectangular shape depicted in the example of FIG. 4 or other shape that is selected for a vent area and corresponding cover portion 402.

Figure 5:
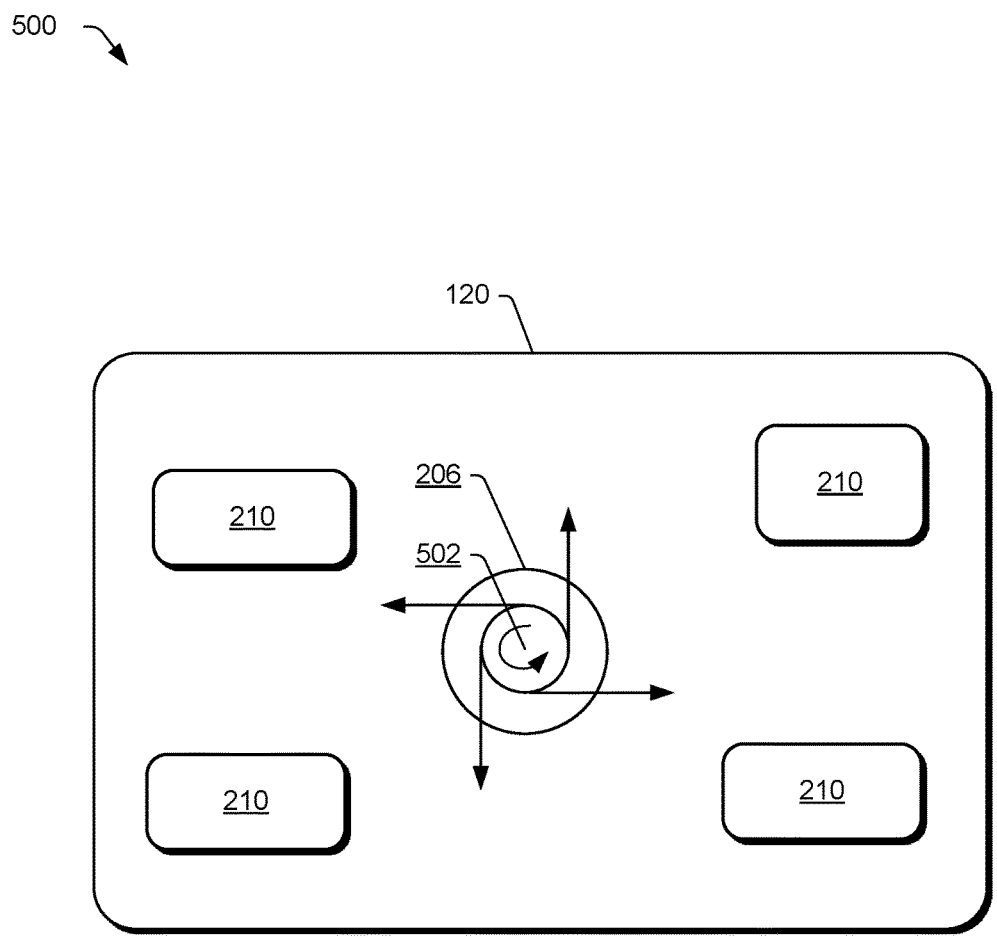
FIG. 5 depicts an example interior view of a housing of a computing device that depicts a blower as dispersing air to components mounted within the housing.

FIG. 5 depicts generally at 500 an example interior view of a housing of a computing device that depicts a blower as dispersing air to components mounted within the housing. In this example, the blower 206 is shown as a centrifugal blower having an air intake 502 that is draws air in generally perpendicular to the plane of the drawing and corresponding plane of the housing 120 that is illustrated. In accordance with techniques described herein, the blower 206 may draw the air in through one or more micro-hole vents 204 (not shown) located on surfaces of the housing 120. The blower 206 is designed to turn the air ninety degrees and disperse the air out laterally throughout the housing 120 (e.g., within the plane of the drawing and housing) to various heat-generating devices 220. In one or more implementations, air is dispersed via flow conduits 208 integrated with the housing.

Figure 6:
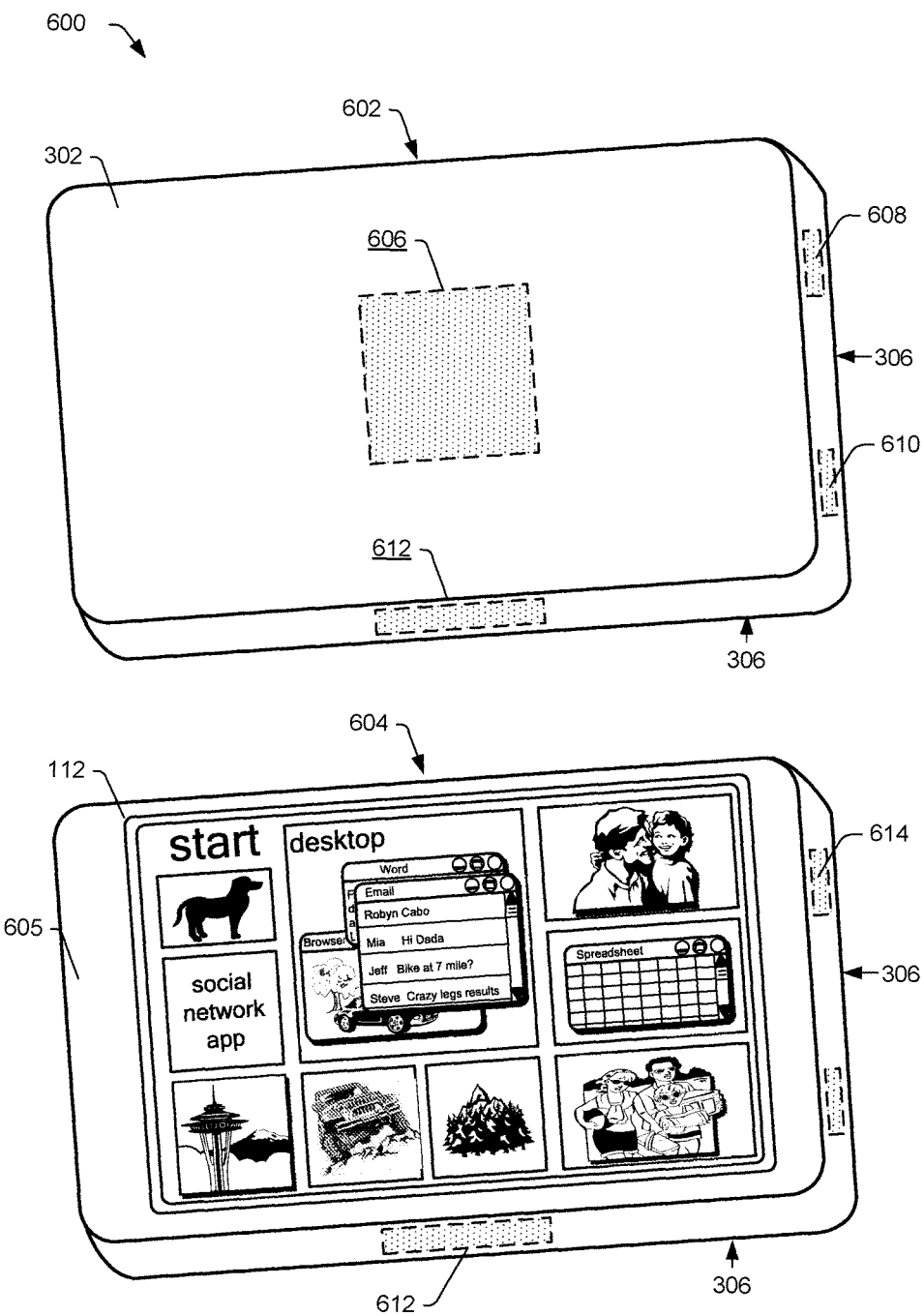
FIG. 6 depicts example perspective views of a back surface and a front surface of a computing device that depicts example locations for micro-vents in accordance with one or more implementations.

FIG. 6 depicts generally at 600 both an example perspective view 602 of a back surface and an example perspective view 604 of a front surface of a computing device that illustrate example locations for micro-vents in accordance with one or more implementations. As represented in FIG. 6, the back surface 302 is opposite of the front surface 605 which includes a display device 112 of the computing device. The view 602 of the back surface 302 illustrates positioning of a micro-hole vent 204 at a location 606 on the back surface 302, such as in the examples of FIGS. 3 and 4. In addition or alternatively, one or more micro-hole vents 204 may be associated with other locations on the back surface 302 and other surfaces of device. For example, additional vents are shown in FIG. 6 at locations 608, 610, 612 and 614 along the bottom edge and side edges of the device as shown in the view 602 of the back surface and view 604 of the front surface. Thus, one or multiple micro-hole vents 204 may be provided with a device at various locations. In an implementation, the vents may include one or both of intake vents and exhaust vents for a ventilation system 124 of a computing device.

Figure 7:
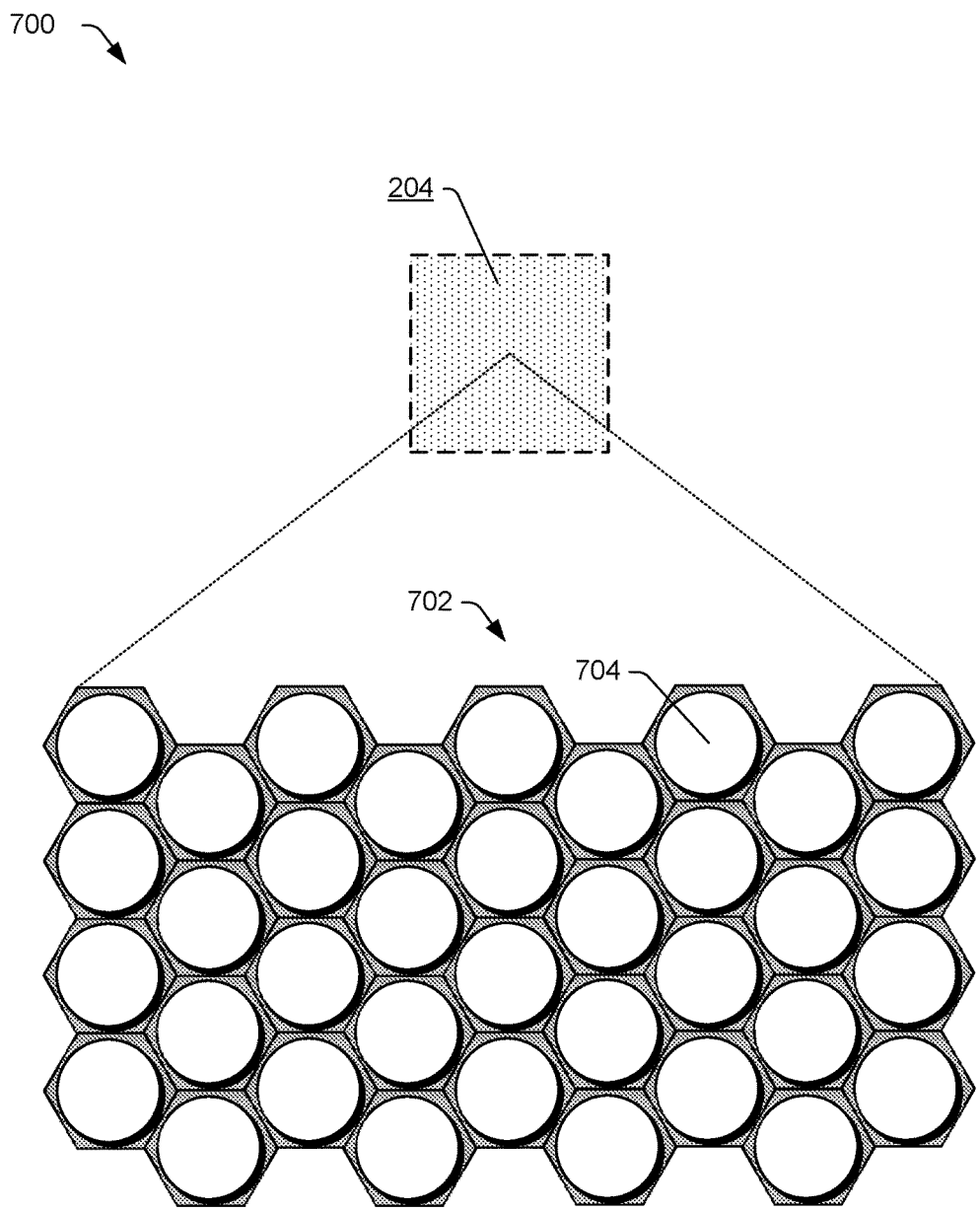
FIG. 7 depicts an example pattern of micro-holes of a micro-vent in accordance with one or more implementations.

FIG. 7 depicts generally an example pattern of micro-holes of a micro-hole vent in accordance with one or more implementations. Here, a close-up view 702 of a portion of a micro-vent 204 is illustrated to show but one example arrangement of micro-holes 704 in a pattern. In particular, FIG. 7 depicts a honey-comb or hexagonal pattern that may be employed in one or more implementations. A variety of other suitable patterns may also be employed. In general, a suitable pattern enables close packing of the micro-holes 704 to provide enough coverage for sufficient fluid flow. As mentioned the coverage may be in the range of about twelve thousand to fifty thousand holes per square inch. Likewise, the arrangement of holes may result in open area for micro-hole vents that is greater than fifty percent.

FIG. 8 depicts an example procedure 800 for assembly of a computing device that includes one or more micro-vents in accordance with one or more implementations. The following discussion describes techniques that may be used to produce and assemble components of a computing device that include micro-hole vents for ventilation as described in this document. Aspects of each of the procedures may be implemented in hardware, firmware, or software, or a combination thereof. The procedures are shown as a set of blocks that specify operations performed by one or more devices and are not necessarily limited to the orders shown for performing the operations by the respective blocks. In portions of the following discussion, reference may be made to the operating environment 100 of FIG. 1 and the example details of FIGS. 2-7, respectively.

A plurality of micro-holes are formed in one or more vent surfaces for a computing device that are visually imperceptible to human eyes and enable air flow for a ventilation system of the computing device (block 802). For example, various vent surfaces may be established on a housing 120 of a computing device 102. The vent surfaces may correspond to positions within the housing 120 for components of a ventilation system 124 including an air intake location, a blower, and exhaust points of the housing. For instance, one of the vent surfaces may be configured as an intake vent for a blower 206. The intake vent surface may be located on a back surface 302 of the housing opposite of a front surface 605 of the housing as previously described. Additionally, one or more vent surfaces for an intake or exhaust vent may be established on various edges of a device as previously noted. For instance, one or more vent surfaces configured as exhaust vents may be established along edges of the housing. Vent surfaces may even be established on a front surface 605 (e.g., the viewing surface) in some designs. Since the micro-hole vents are effectively invisible, placement of the micro-hole vents 204 on any surface of the device does not detract from the aesthetic characteristics and appeal of the device design.

The formation of micro-holes and corresponding micro-hole vents may involve creating at least some micro-holes directly in the housing for one of said vent surfaces (block 804). As noted, micro-holes may be formed in the housing using various techniques such as laser etching, drilling, chemical etching and so forth. In addition or alternatively, formation of micro-holes may include producing a separate cover portion having micro-holes that is configured for attachment to one of said vent surfaces of the housing (806). Thus, a cover portion may be manufactured as a separate piece and then attached to the housing in the manner previously described. Micro-holes for the cover portion may be also formed using various techniques including but not limited to laser etching, drilling, chemical etching and so forth. Accordingly, a housing may be configured to include one or more micro-hole vents 204 including either or both of micro-hole vents that are formed directly in the housing or micro-hole vents that are formed as attachable cover pieces.

Components are arranged within the housing of the computing device including mounting a blower for the ventilation system in alignment with one of said vent surfaces to enable air intake through corresponding micro-holes for cooling of the computing device (block 808). For example, a housing 120 of a computing device 102 may be configured to contain various components including heat-generating devices 210, such as a processing system, memory, sensors, a graphics processor, and so forth. Components may be secured in the housing in various ways including but not limited to soldering, mechanical fasteners, lamination, adhesive attachment, and so forth. In addition, the housing 120 may be designed to include a ventilation system for cooling of the components, such as the example ventilation system 124 discussed in relation to FIG. 2. The ventilation system 124 may include a blower 206 that is mountable within the housing 120. The housing is designed to align the blower 206 with one of said vent surfaces. In particular, an air intake of the blower is aligned with a corresponding micro-hole vent 204 integrated in the housing (directly or as an attachable cover portion). This alignment enable air intake to occur through corresponding micro-holes of the micro-hole vent for cooling of the computing device.

Figure 9:
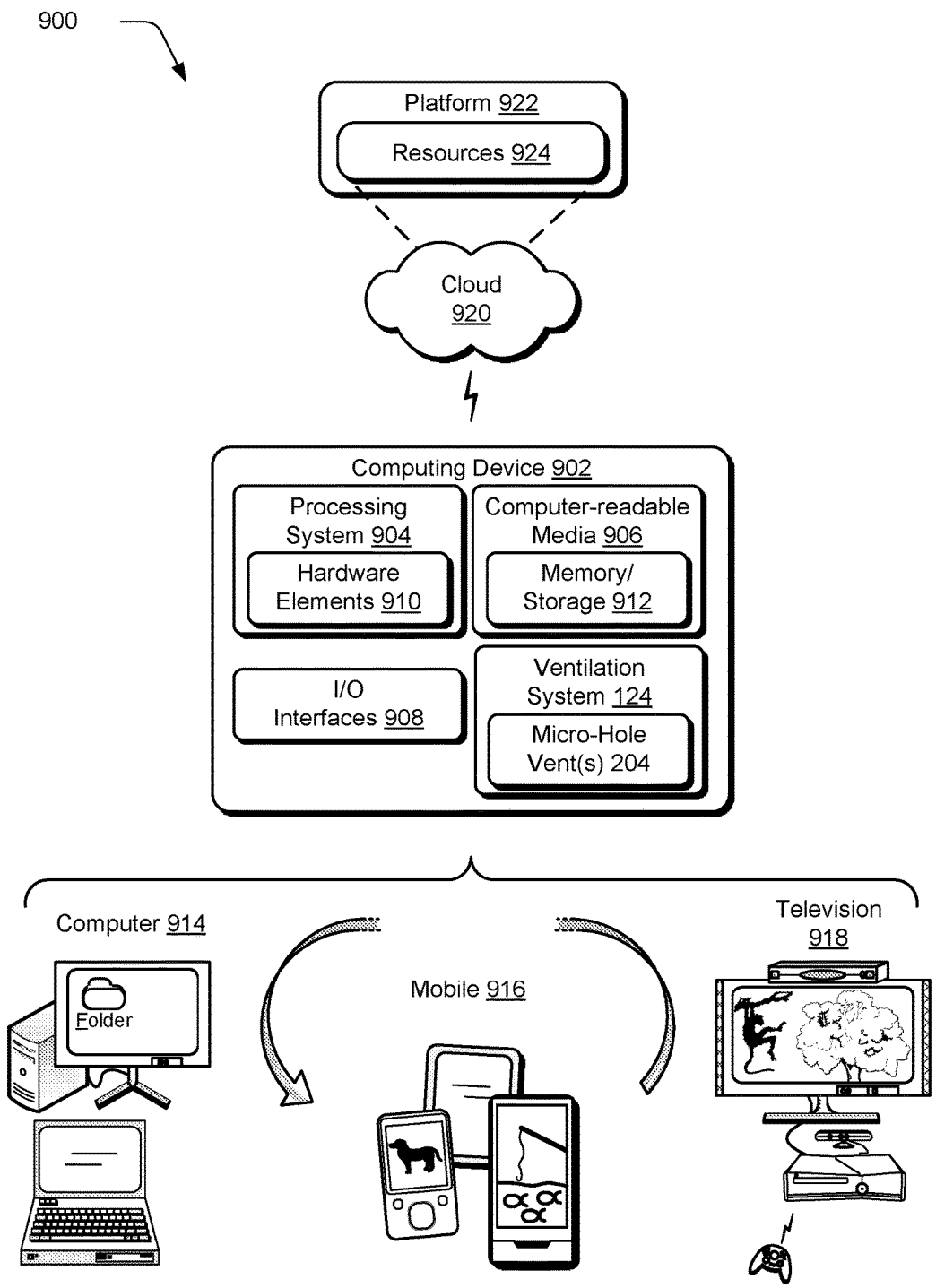
FIG. 9 illustrates an example system including various components of an example device that can be implemented as any type of computing device as described with reference to FIGS. 1-8 to implement embodiments of the techniques described herein.

Having considered the foregoing example details and procedures related to implementations of micro-hole vents for a ventilation system, consider now a discussion of example systems, devices, and components that may be make use of micro-hole vents as described herein in one or more implementations Example System and Device FIG. 9 illustrates an example system generally at 900 that includes an example computing device 902 that is representative of one or more computing systems and/or devices that may implement the various techniques described herein. The computing device 902 may be, for example, a server of a service provider, a device associated with a client (e.g., a client device), an on-chip system, and/or any other suitable computing device or computing system.

The example computing device 902 as illustrated includes a processing system 904, one or more computer-readable media 906, and one or more I/O interface 908 that are communicatively coupled, one to another. The computing device may also include a ventilation system 124 having micro-hole vents as described herein. Although not shown, the computing device 902 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 904 is representative of functionality to perform one or more operations using hardware. Accordingly, the processing system 904 is illustrated as including hardware element 910 that may be configured as processors, functional blocks, and so forth. This may include implementation in hardware as an application specific integrated circuit or other logic device formed using one or more semiconductors. The hardware elements 910 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 906 is illustrated as including memory/storage 912. The memory/storage 912 represents memory/storage capacity associated with one or more computer-readable media. The memory/storage component 912 may include volatile media (such as random access memory (RAM)) and/or nonvolatile media (such as read only memory (ROM), Flash memory, optical disks, magnetic disks, and so forth). The memory/storage component 912 may include fixed media (e.g., RAM, ROM, a fixed hard drive, and so on) as well as removable media (e.g., Flash memory, a removable hard drive, an optical disc, and so forth). The computer-readable media 906 may be configured in a variety of other ways as further described below.

Input/output interface(s) 908 are representative of functionality to allow a user to enter commands and information to computing device 902, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 902 may be configured in a variety of ways as further described below to support user interaction.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 902. By way of example, and not limitation, computer-readable media may include "computer-readable storage media" and "computer-readable signal media."

"Computer-readable storage media" refers to media and/or devices that enable storage of information in contrast to mere signal transmission, carrier waves, or signals per se. Thus, computer-readable storage media does not include signal-bearing medium, transitory signals, or signals per se. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" refers to a signal-bearing medium that is configured to transmit instructions to the hardware of the computing device 902, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 910 and computer-readable media 906 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 910. The computing device 902 may be configured to implement particular instructions and/or functions corresponding to the software and/or hardware modules. Accordingly, implementation of a module that is executable by the computing device 902 as software may be achieved at least partially in hardware, e.g., through use of computer-readable storage media and/or hardware elements 910 of the processing system 904. The instructions and/or functions may be executable/operable by one or more articles of manufacture (for example, one or more computing devices 902 and/or processing systems 904) to implement techniques, modules, and examples described herein.

As further illustrated in FIG. 9, the example system 900 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 900, multiple devices are interconnected through a central computing device. The central computing device may be local to the multiple devices or may be located remotely from the multiple devices. In one embodiment, the central computing device may be a cloud of one or more server computers that are connected to the multiple devices through a network, the Internet, or other data communication link.

In one embodiment, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one embodiment, a class of target devices is created and experiences are tailored to the generic class of devices. A class of devices may be defined by physical features, types of usage, or other common characteristics of the devices.

In various implementations, the computing device 902 may assume a variety of different configurations, such as for computer 914, mobile 916, and television 918 uses. Each of these configurations includes devices that may have generally different constructs and capabilities, and thus the computing device 902 may be configured according to one or more of the different device classes. For instance, the computing device 902 may be implemented as the computer 914 class of a device that includes a personal computer, desktop computer, a multi-screen computer, laptop computer, netbook, and so on. Computing device 902 may be a wearable device, such as a watch or a pair of eye glasses, or may be included in a household, commercial, or industrial appliance.

The computing device 902 may also be implemented as the mobile 916 class of device that includes mobile devices, such as a mobile phone, portable music player, portable gaming device, a tablet computer, a multi-screen computer, and so on. The computing device 902 may also be implemented as the television 918 class of device that includes devices having or connected to generally larger screens in casual viewing environments. These devices include televisions, set-top boxes, gaming consoles, and so on.

The techniques described herein may be supported by these various configurations of the computing device 902 and are not limited to the specific examples of the techniques described herein.

Functionality may also be implemented all or in part through use of a distributed system, such as over a "cloud" 920 via a platform 922 as described below. The cloud 920 includes and/or is representative of a platform 922 for resources 924. The platform 922 abstracts underlying functionality of hardware (e.g., servers) and software resources of the cloud 920. The resources 924 may include applications and/or data that can be utilized while computer processing is executed on servers that are remote from the computing device 902. Resources 924 can also include services provided over the Internet and/or through a subscriber network, such as a cellular or Wi-Fi network.

The platform 922 may abstract resources and functions to connect the computing device 902 with other computing devices. The platform 922 may also serve to abstract scaling of resources to provide a corresponding level of scale to encountered demand for the resources 924 that are implemented via the platform 922. Accordingly, in an interconnected device embodiment, implementation of functionality described herein may be distributed throughout the system 900. For example, the functionality may be implemented in part on the computing device 902 as well as via the platform 922 that abstracts the functionality of the cloud 920.

CONCLUSION

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A client computing device comprising:
   a housing in which components of the client computing device are mounted;
   a ventilation system for cooling of the client computing device including a blower; and
   a micro-hole vent aligned with an intake of the blower that enables intake of air from an exterior of the housing to an interior of the housing, the micro-hole vent including a plurality of micro-holes through which air for the cooling of the client computing device passes, the micro-holes are less than two-hundred and fifty microns wide, wherein the micro-hole vent comprises a number of micro-holes per square inch in a range of twelve thousand to fifty thousand micro-holes per square inch, and wherein the width of the micro-holes, the number of micro-holes per square inch, and a pattern of the micro-holes are selected to enable the intake of air through the micro-holes while concealing the micro-holes from users of the client computing device.

2. A computing device as described in claim 1, wherein the components comprise one or more heat-generating devices.

3. A computing device as described in claim 1, wherein the micro-hole vent aligned with the intake is constructed by forming the plurality of micro-holes directly in a surface of the housing.

4. A computing device as described in claim 3, wherein the surface in which the plurality of micro-holes are formed comprises a back surface of the client computing device that is opposite a front surface of the housing having a display screen.

5. A computing device as described in claim 1, wherein the micro-hole vent aligned with the intake is constructed as a separate cover portion in which the micro-holes are formed that is attached to the housing.

6. A computing device as described in claim 1, wherein the client computing device is a tablet computing device.

7. A computing device as described in claim 1, wherein the pattern of the micro-holes comprises a honey-comb pattern.

8. A computing device as described in claim 1, wherein the plurality of micro-holes have diameters in a range of fifty to two hundred microns.

9. A computing device as described in claim 1, wherein the blower comprises a centrifugal blower mounted within the housing to draw air in through the micro-hole vent perpendicularly to a surface of the housing in which the micro-hole vent is located and disperse the air throughout the client computing device via one or more flow conduits integrated within the housing.

10. A computing device as described in claim 1, further comprising one or more additional micro-hole vents including a plurality of micro-holes through which air for the cooling is exhausted that are configured to be invisible to unaided human eyes.

11. A housing for a client computing device comprising:
    a mounting location within the interior of the housing to mount a blower of a ventilation system designed for cooling of components within the housing; and
    a micro-hole vent through which air flows for the cooling of the components that is integrated with the housing and aligned with an intake of the blower when mounted at the mounting location in the housing, the micro-hole vent formed as a pattern of micro-holes that are less than two hundred and fifty microns wide, wherein the micro-hole vent comprises a number of micro-holes per square inch in a range of twelve thousand to fifty thousand micro-holes per square inch, and wherein the width of the micro-holes, the number of micro-holes per square inch, and the pattern of the micro-holes are selected to enable the air flow through the micro-holes while concealing the micro-holes from users of the client computing device.

12. A housing as described in claim 11, wherein the housing is constructed of metal and the plurality of micro-holes are formed directly through a surface of the metal housing.

13. A housing as described in claim 11, wherein the micro-hole vent comprises a cover portion formed separately from the housing and attached to the housing in alignment with the intake of the blower, such that the micro-holes of the micro-hole vent enable air to flow from an exterior of the housing to the mounting location.

14. A housing as described in claim 11, further comprising one or more additional micro-hole vents that are configured as exhaust vents for the ventilation system located along edges of the housing, and each formed as a pattern of micro-holes that are invisible to unaided human eyes.

15. A method comprising:
    forming a plurality of micro-holes that are less than two-hundred fifty microns wide in one or more vent surfaces for a client computing device that enable air flow for a ventilation system of the client computing device, the vent surface comprising a number of micro-holes per square inch in a range of twelve thousand to fifty thousand micro-holes per square inch, wherein characteristics of the vent surface are configured to match characteristics of a housing of the client computing device, and wherein the width of the micro-holes, the number of micro-holes per square inch, and the characteristics of the vent surface are selected to enable air flow through the micro-holes while concealing the micro-holes from users of the client computing device; and arranging components within the housing of the client computing device including mounting a blower for the ventilation system in alignment with one of said vent surfaces to enable air intake through corresponding micro-holes for cooling of the client computing device.

16. A method as described in claim 15, wherein forming the plurality of micro-holes comprises creating micro-holes directly in the housing for one of said vent surfaces.

17. A method as described in claim 15, wherein forming the plurality of micro-holes comprises producing a separate cover portion having micro-holes that is configured for attachment to one of said vent surfaces of the housing.

18. A method as described in claim 15, wherein forming the plurality of micro-holes comprises forming one of said vent surfaces as an intake vent for the blower on a back surface of the housing opposite of a front surface of the housing configured to contain a display device for the client computing device.

19. A method as described in claim 18, wherein forming the plurality of micro-holes comprises forming one or more vent surfaces as exhaust vents along edges of the housing.

20. A method as described in claim 15, wherein the characteristics of the housing that the characteristics of the vent surface are configured to match one or more of a texture, a color, a material, and a patterning of the housing.

* * * * *